United States Patent [19]
Crabbé et al.

[11] Patent Number: 5,485,029
[45] Date of Patent: Jan. 16, 1996

[54] ON-CHIP GROUND PLANE FOR SEMICONDUCTOR DEVICES TO REDUCE PARASITIC SIGNAL PROPAGATION

[75] Inventors: Emmanuel F. Crabbé, Chappaqua; Keith A. Jenkins, Tarrytown; Jeffrey L. Snare, Verbank, all of N.Y.

[73] Assignee: International Business Machines Corporation, Armonk, N.Y.

[21] Appl. No.: 268,350

[22] Filed: Jun. 30, 1994

[51] Int. Cl.$^6$ ............................ H01L 29/72; H01L 27/04
[52] U.S. Cl. ........................ 257/501; 257/347; 257/508; 257/901; 257/517
[58] Field of Search .................................. 257/774, 500, 257/501, 517, 518, 901, 499, 347, 520, 508

[56] References Cited

U.S. PATENT DOCUMENTS

| | | | |
|---|---|---|---|
| 4,454,647 | 6/1984 | Joy et al. | 257/517 |
| 4,486,942 | 12/1984 | Hirao | 257/518 |
| 4,791,473 | 12/1988 | Phy | 357/70 |
| 4,819,052 | 4/1989 | Hutter | 257/508 |
| 4,935,800 | 6/1990 | Taguchi | 257/501 |
| 5,065,216 | 11/1991 | Suzuki et al. | 257/520 |
| 5,073,815 | 12/1991 | Kasaka et al. | 257/508 |
| 5,146,304 | 9/1992 | Yue et al. | 257/518 |
| 5,220,190 | 6/1993 | Taguchi et al. | 257/499 |
| 5,306,942 | 4/1994 | Fujii | 257/508 |

FOREIGN PATENT DOCUMENTS

| | | | |
|---|---|---|---|
| 0250869 | 5/1987 | European Pat. Off. | 257/517 |
| 2551961 | 5/1976 | Germany | 257/517 |
| 0006854 | 1/1986 | Japan | 257/517 |
| 179127 | 8/1987 | Japan | 257/520 |
| 0164064 | 6/1989 | Japan | 257/517 |

OTHER PUBLICATIONS

Stephen F. Adam, "Microwave Theory and Applications," Prentice–Hall, Inc., Englewood Cliffs, N.J., 1969, pp. 86–89.

"Application Note 154: S–Parameter Design", Hewlett Packard, Apr. 1972, pp. 1–22.

P. J. van Wijnen et al., "A New Straightforward Calibration and Correction Procedure of 'On Wafer' High Frequency S–Parameter Measurements (45 MHz–18 GHz)," Digest of 1987 Bipolar Circuits and Technology Meeting, pp. 70–73.

Emmanuel Crabbé et al., "Test Site for Common–Collector S–Parameter Measurements," *IBM Technical Disclosure Bulletin*, vol. 33, No. 4, Sep. 1990, pp. 371–372.

Adele Schmitz et al., "A Deep–Submicrometer Microwave/Digital CMOS/SOS Technology,", *IEEE Electron Device Letters*, vol. 12, No. 1, Jan. 1991, pp. 16–17.

Anthony Caviglia et al., "Microwave Performance of SOI n–MOSFET's and Coplanar Waveguides," *IEEE Electron Device Letters*, vol. 12, No. 1, Jan. 1991, pp. 26–27.

A. K. Agarwal et al., "MICROX–An Advanced Silicon Technology for Microwave Circuits up to X–Band," *IEDM Technical Digest*, 1991, pp. 687–690.

Maurice Hanes et al., "MICROX–An All–Silicon Technology for Monolithic Microwave Integrated Circuits," *IEEE Electron Device Letters*, vol. 14, No. 5, May 1993, pp. 219–221.

*Primary Examiner*—Robert P. Limanek
*Assistant Examiner*—Alexander Oscar Williams
*Attorney, Agent, or Firm*—Sterne, Kessler, Goldstein & Fox; David Aker

[57] ABSTRACT

A semiconductor chip having an on-chip ground plane comprising a low resistivity semiconductor region in a plurality of non-device regions of the chip and reach-through regions electrically connected to the low resistivity semiconductor region. One or more front-side contacts are used to electrically connect the reach-through regions and the low resistivity semiconductor region to a ground potential to electrically ground the on-chip ground plane.

24 Claims, 5 Drawing Sheets

5,485,029

ON-CHIP GROUND PLANE FOR SEMICONDUCTOR DEVICES TO REDUCE PARASITIC SIGNAL PROPAGATION

TECHNICAL FIELD

The present invention relates to the field of semiconductor devices, and more particularly, to an on-chip ground plane with a front-side contact for semiconductor devices to reduce parasitic signal propagation.

BACKGROUND ART

Errors due to parasitic signal propagation adversely affect operation of semiconductor devices, as well as device testing.

An example of this problem may be observed during scattering parameter (abbreviated S-parameter) measurements on bipolar transistors using the Common-Emitter (CE) configuration. S-parameter measurements are common practice and are used extensively to characterize the high-frequency performance of transistors. The CE configuration is preferred for characterizing bipolar transistors used for circuit applications because it is the closest to the configuration used in most digital circuits. Other configurations such as Common-Collector measurements are not sensitive to all capacitances loading the device under test (e.g., collector-to-substrate capacitance). For a discussion of S-parameters see "Application Note 154: S-Parameter Design," Hewlett Packard, April, 1972, pp. 1–22; and "Microwave Theory and Applications," Stephen F. Adam, Prentice-Hall, Inc., Englewood Cliffs, N.J., 1969, pp. 86–89.

A 2-port network is used for CE S-parameter measurements. These two ports are called signal ports 1 and 2, and share a common ground connection. Signal ports 1 and 2 comprise rectangular shaped signal probe pads that are typically 70×70 or 100×100 µm². The port 1 and port 2 signal probe pads are connected by conductive fingers to the base and collector regions of the transistor (i.e., the device under test), respectively. The emitter region is grounded for the measurements, and thus provides the common ground for ports 1 and 2. Using the 2-port network approach has its disadvantages because parasitic signals can propagate through the substrate between ports 1 and 2 during S-parameter measurements of devices built on silicon (Si) substrates.

Parasitic signal propagation produces resonances observed in the vicinity of 1–2 GHz for a reflection measurement on either an "open" calibration structure or on a transistor. These resonances are not corrected by conventional calibration procedures, and thus lead to significant errors in the extraction of S-parameters, particularly for high-gain, high-frequency devices.

Another effect of the parasitic signal propagation is the parasitic transmission between ports 1 and 2. Some calibration procedures do not correct for this error, while others correct for it but still leave some residual error. These errors are inversely proportional to the size of the transistor and proportional to the size of the signal probe pads.

The errors discussed above, particularly parasitic transmission, also affect the performance of transistors during normal operation.

The ground planes typically used today for applications such as analog circuits are the silicon substrates under the active region on the surface on which the transistors/circuits are located. The ground plane is then contacted with a back-side contact.

In complex circuits with many interconnected transistors, a ground plane can eliminate resonances causing signal attenuation or non-linearity (critical for analog applications), and in more general terms, reduce electrical noise. This type of extraneous signal propagation occurs via the substrate.

A second path for extraneous signal propagation occurs between the interconnect lines. The use of a ground plane in the silicon allows reduction of cross-talk or noise generation on adjacent interconnect lines: the electric field radiating from a signal lines terminates on the ground plane rather than coupling to an adjacent line. With a complete ground plane, interconnect lines with controlled impedances can also be achieved. This becomes increasingly important as the frequencies at which signals propagate increase leading to enhanced sensitivity of an interconnect line to its surroundings.

Interconnects wired on the first level of metal, i.e., the closest one to the substrate, will be the ones benefiting the most. They may allow, in some cases, elimination of a metal ground plane above the first interconnect level, or elimination of two parallel grounded interconnects on either side of the signal line ensuring reduction of crosstalk.

While the advantages discussed above play a critical role in high-frequency analog circuits, they are becoming significant issues for digital applications operating at very high clock frequencies.

U.S. Pat. No. 4,791,473 to Phy is directed to a plastic semiconductor device package having an internal ground plane which provides an interlead isolation in order to reduce high frequency signal degradation within the package. A drawback of the Phy plastic package, as well as other conventional techniques such as grounded interconnects, is that such structures require additional manufacturing steps above and beyond those required to produce the semiconductor chip itself.

What is desired is an on-chip ground plane for semiconductor devices that reduces parasitic signals during device operation, and can be manufactured without additional manufacturing steps or cost to the fabrication of the chip itself.

DISCLOSURE OF INVENTION

The present invention is directed to an on-chip ground plane for reducing high frequency signal degradation and parasitic signal propagation.

The on-chip ground plane comprises a buried low resistivity semiconductor region in a plurality of non-device regions of the chip, reach-through regions electrically connected to the buried low resistivity semiconductor region, and a front-side contact electrically connected to the reach-through regions for electrically coupling the reach-through regions and the buried low resistivity semiconductor region to a ground potential to electrically ground the on-chip ground plane. The front-side contact has a large contact area which improves the definition of both DC and AC ground.

The on-chip ground plane of the present invention does not require additional semiconductor manufacturing steps or cost. The on-chip ground plane of the present invention also eliminates the cost of including a ground plane in the semiconductor device package or in the metal interconnect layers.

The foregoing and other features and advantages of the invention will be apparent from the following more particular description of preferred embodiments of the invention, as illustrated in the accompanying drawings.

BRIEF DESCRIPTION OF DRAWINGS

The invention will be better understood if reference is made to the accompanying drawings.

In the drawings, like reference numbers indicate identical or functionally similar elements. Additionally, the leftmost digit of the reference number identifies the drawing in which the reference number first appears.

BEST MODE FOR CARRYING OUT THE INVENTION

Figure 1:
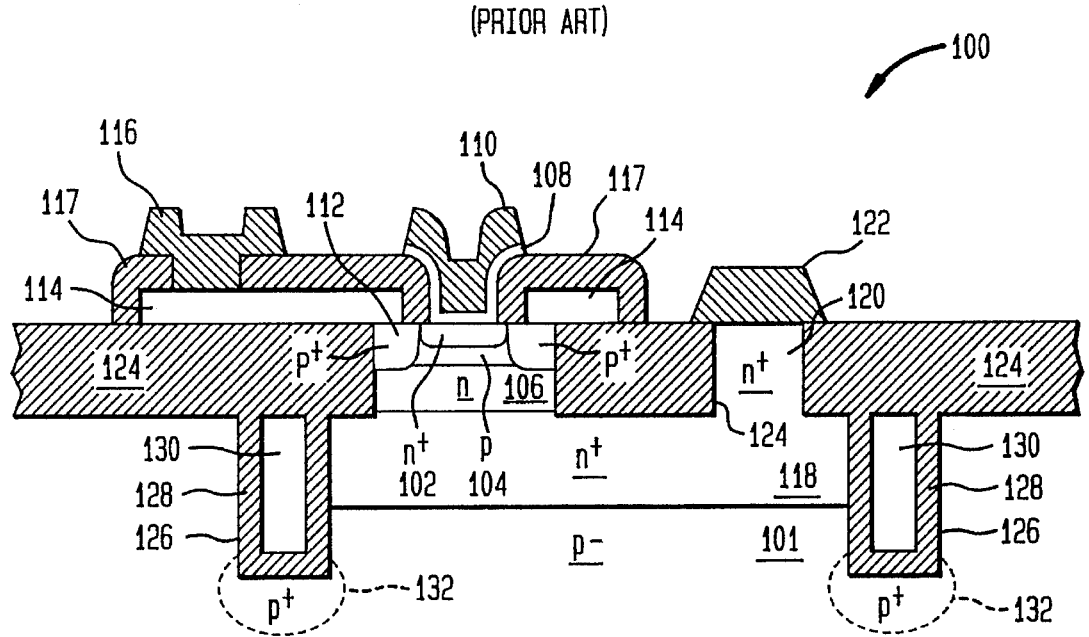
FIG. 1 shows a representative example of a conventional bipolar transistor.

FIG. 1 shows a representative example of a conventional bipolar junction transistor (BJT) 100 with isolation trench and P-N junction isolation, as well as a patterned subcollector. The BJT of 100 includes a silicon substrate 101 of p$^-$ (p minus) type conductivity. BJT 100 is a vertical type device with an emitter region 102 of n$^+$ (n plus) type conductivity, a base region 104 of p type conductivity and a collector region 106 of n type conductivity. An emitter polysilicon contact layer 108 and an emitter metal contact layer 110 are used to electrically contact the emitter region 102. Similarly, a base polysilicon contact layer 114 and a base metal contact layer 116 are used to electrically contact the base region 104 via a low resistivity base contact region 112 of p$^+$ type conductivity. An insulating layer 117 is patterned to electrically isolate the emitter and base contact layers. (Note that conventions such as p$^-$ and n$^+$ are given by way of example and that the corresponding dopant types and concentrations, etc., although not critical to the implementation of the present invention, would be apparent to a person skilled in the relevant art.)

The BJT 100 also includes a low resistivity subcollector 118 of n$^+$ type conductivity. The subcollector 118 is a buried layer. The buried subcollector 118 is electrically contacted using a reach-through subcollector contact region 120 of n$^+$ type conductivity and a collector/subcollector metal contact layer 122 located at an upper surface of the BJT 110. The buried subcollector 118, reach-through subcollector contact region 120 and the collector/subcollector metal contact layer 122 (collectively called the collector contact) provide electrical connectivity to the collector region 106. P-N junction isolation is provided for BJT 100 at the interface between buried subcollector 118 and the substrate 101.

A field oxide layer 124 completely surrounds the BJT 100 and thus provides lateral electrical isolation between the BJT 100 and adjacent devices (not shown), as well as isolation between the active device regions 102, 104, 106 and the collector contact. The field oxide layer 124 may be a recessed oxide isolation (ROX) or shallow trench isolation (STI).

Additionally, vertical isolation is provided down to substrate 101 using an isolation trench 126 filled with an oxide 128 and polysilicon 130. The isolation trench 126 completely surrounds BJT 100 so as to isolate it from any other lateral devices (not shown). In addition, p$^+$ type concentration channel stops 132 are formed at the bottom of isolation trench 126 to further prevent carrier transport between devices. The buried subcollector 118 is patterned such that it lies only in a region of the substrate isolated by the trench 126.

Figure 2:
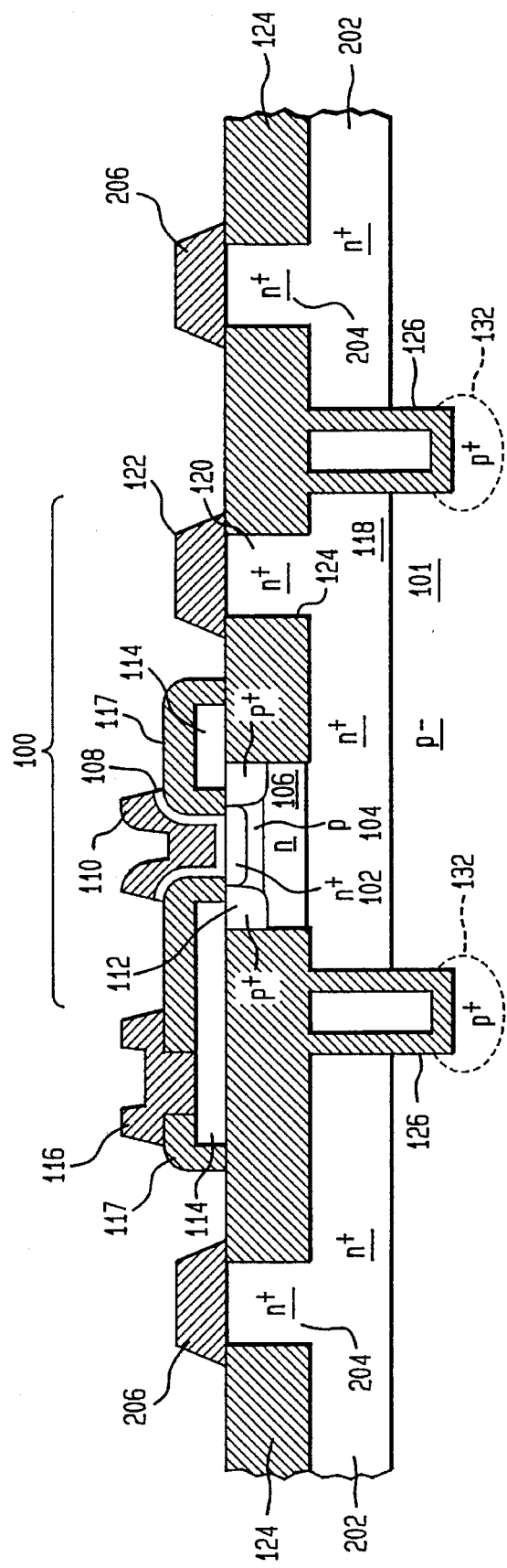
FIG. 2 shows the on-chip ground plane of the present invention.

The present invention will now be described in connection with FIG. 2. FIG. 2 shows the on-chip ground plane of the present invention, which is a low resistivity subcollector layer 202 having an n$^+$ type concentration. The blanket subcollector layer 202 is electrically isolated from the subcollector 118 of BJT 100 by isolation trench 126. Reach-through regions 204 of n$^+$ type concentration and front-side metal ground contacts 206 provide a low resistivity electrical connection to subcollector layer 202. The metal ground contacts 206 electrically connect the subcollector layer 202 to an electrical ground potential (not shown) on or off of the semiconductor chip so that an on-chip ground plane can be formed.

The present invention has been successfully reduced to practice. It has been verified that the subcollector layer 202 functions as an on-chip ground plane to reduce parasitic coupling between active devices and reduces high frequency signal degradation.

The subcollector layer 202 is formed simultaneously with the subcollector 118 using ion implantation, deposition, or the like, as would be apparent to a person skilled in the relevant art. However, as noted above, because of the presence of the isolation trench(es) 126, the on-chip ground plane (i.e., subcollector layer 202) and the subcollector 118 are completely electrically isolated. Grounding of the on-chip ground plane does not affect the electrical state of the subcollector 118 or the collector region 106. In a further embodiment, the substrate can be an insulating substrate, such as sapphire or glass, rather that p type silicon. The fabrication techniques used to manufacture the on-chip ground plane and the example BJT 100, as well as any other devices enclosed in the isolation regions formed by the isolation trenches 126, would become apparent to a person skilled in the semiconductor art. In addition, the on-chip ground plane could be patterned so as to only be formed on part of the chip.

Figure 3:
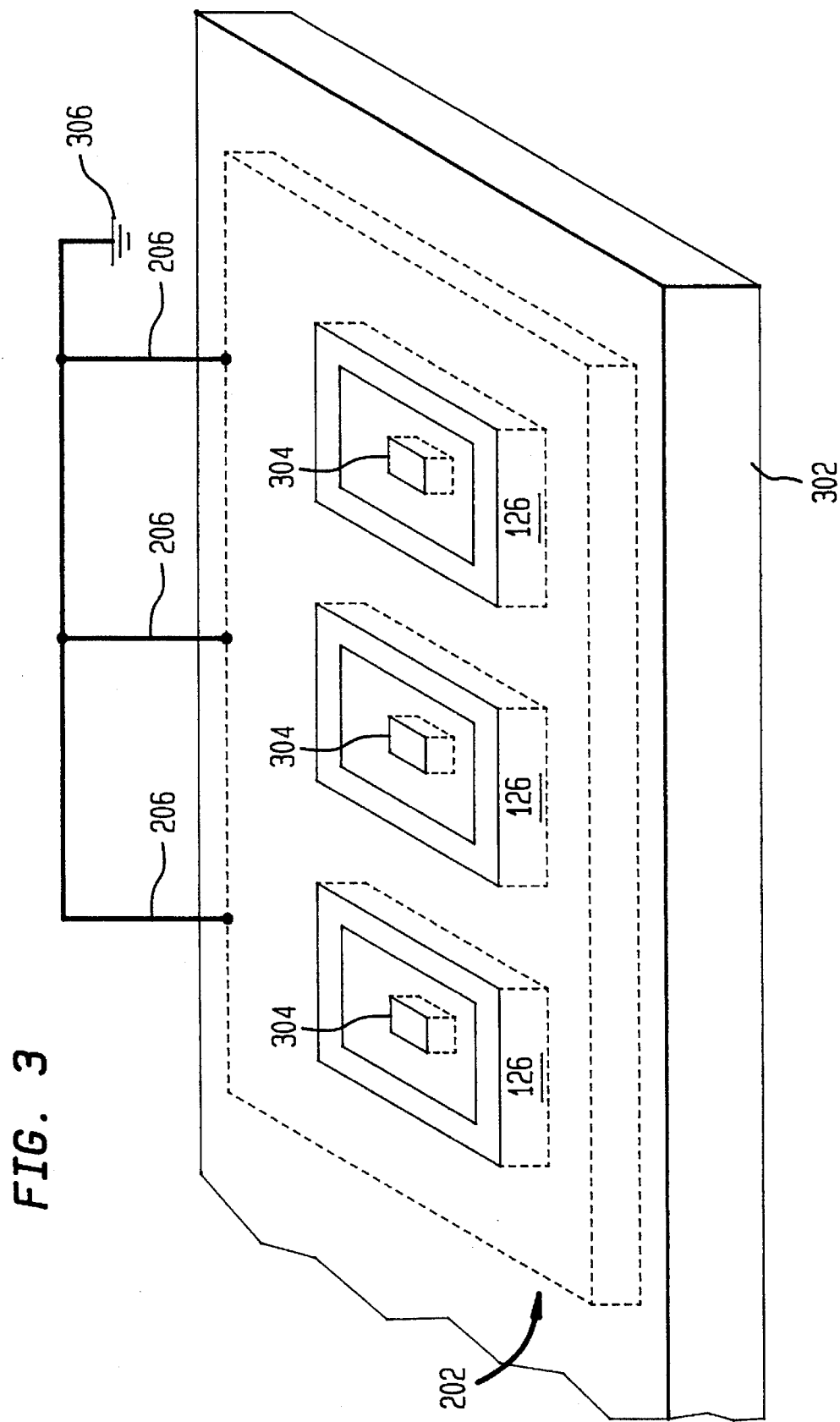
FIG. 3 shows a diagrammatic representation of the on-chip ground plane of the present invention.

FIG. 3 is a diagrammatic representation of the on-chip ground plane of the present invention. A semiconductor chip 302 includes a plurality of semiconductor devices 304 each electrically isolated from one another by the isolation trenches 126. According to the present invention, the buried blanket subcollector 202 is connected to a chip ground potential 306 via ground leads 206 to reduce high frequency signal degradation. The devices 304 may be BJT's, FET's, integrated passive components, or the like, including combinations thereof.

Figure 4:
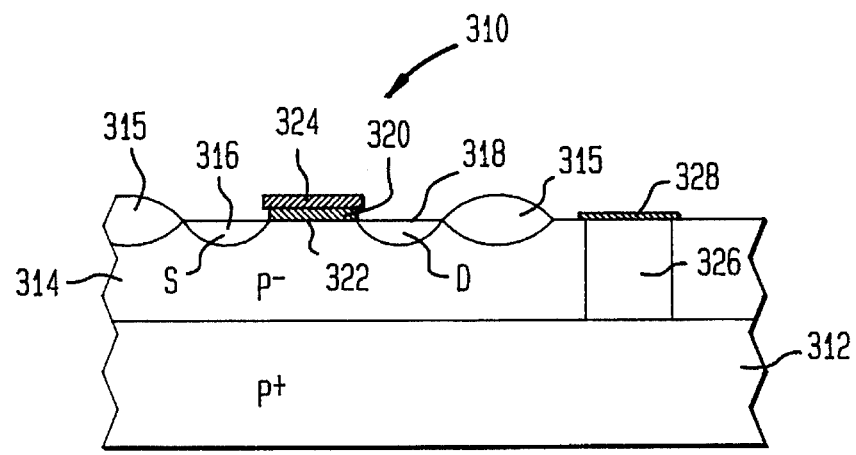
FIG. 4 shows an embodiment of the invention used with field effect transistors.

Referring to FIG. 4, the present invention is applied to a chip wherein a field effect transistor FET 310 is produced in bulk silicon. While an nFET is shown either nFETs or pFETs may be produced.

A p$^+$ substrate 312 forms a ground plane in accordance with the invention. An epitaxial layer 314 of p$^+$ silicon is grown over substrate 312. An oxide isolation layer 315 is formed over the layer 314 in selected regions in order to provide isolation between the devices to be formed. A source region 316 and a drain region 318 are formed by ion implantation or diffusion. A gate insulator 320 is formed over an implanted channel region 322. A metallic or polysilicon gate 324 is formed over gate insulator 320.

Connection to substrate 312, which acts as a ground plane is achieved by forming a large contact 326 between a top metal layer 328 and the underlying p$^+$ substrate 312. Contact 326 is made either with a p-type implant in the p-epi layer 314 with contact metallurgy to connect this to top metal layer 328, or with a tungsten stud contact reaching p$^+$ substrate 312. To act as a ground plane for high frequency signals, the contact dimension, particularly for a p-type implant, must be large enough to obtain a low resistance path between the top metal layer 328 and the p$^+$ substrate 314. It will be understood that additional layers of insulation and metalization are required to make contact to the device as is well known in the art.

For CMOS devices and circuits made in bulk silicon, comprising nFETs and pFETS, the same contacting method as used for nFETs can be used to achieve a ground plane.

Figure 5:
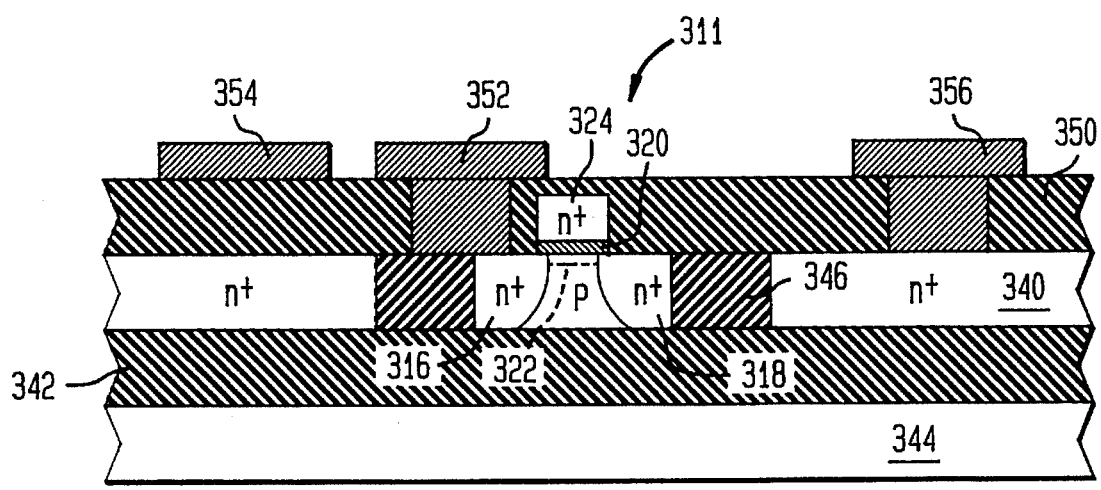
FIG. 5 shows an embodiment of the invention wherein a field effect transistor is formed in silicon on insulator (SOI).

Referring to FIG. 5, for FETs made in a silicon-on-insulator (SOI) technology, the silicon film 340 is typically less than 200 nm thick. Locating a heavily-doped region under the devices would defeat the advantages inherent to SOI structures. Furthermore, a continuous conducting substrate cannot be contacted because of the intervening insulator layer 342 which separates silicon film 340 from the bulk silicon substrate 344. In this technology, a different implementation of the "ground-plane" concept can be achieved by utilizing the silicon layer as illustrated in FIG. 5. Instead of forming an oxide everywhere outside the device regions, a small region of oxide 346 is formed to isolate the devices, such as an FET 311 similar to FET 310 of FIG. 4 wherein like reference numerals denote like parts. The remainder of the silicon film 340 receives an implant, preferably n-type for reduced resistivity. An insulation layer 350 is formed over silicon film 340 to isolate device contacts 352 and metal lines 354 which are then formed. Regions of silicon film 340 used as a ground plane are contacted by the same metallurgy used to contact the source region 316 and the drain region 318, with the contacts 356 being brought to the top of the wafer for connection to ground. Thus, all the unused area of silicon film 340 acts as a ground plane, outside the devices, for the signals on the metal level above.

Unlike conventional techniques which form ground planes in the packaging structure, in the present invention devices are effectively embedded in a structure which has a ground plane within it and that ground plane is effectively grounded to a chip ground or an external ground. According to the present invention a ground plane is created on the semiconductor chip during the stages of the manufacturing process that create the devices themselves.

Another embodiment of the present invention is directed to the geometry of an S-parameter site that eliminates parasitic signal propagation through the substrate by AC grounding the low-resistivity subcollector outside the device region. The structure of the site includes signal probe pads and fingers leading from the signal probe pads to the device under test.

Figure 6:
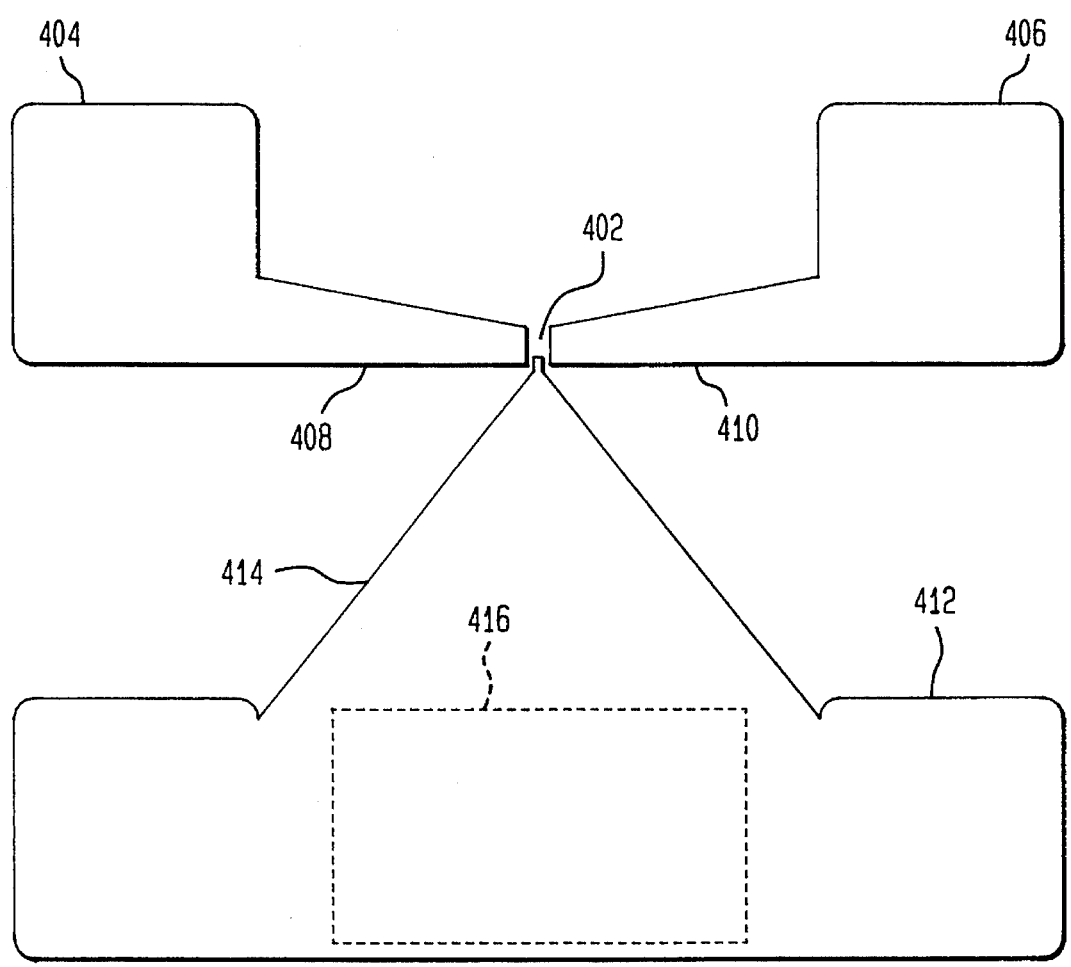
FIG. 6 shows a plan view of an S-parameter site according to the present invention.

A plan view of the S-parameter site according to the present invention is illustrated in FIG. 6. A device under test (e.g., BJT) is shown generally by an arrow at 402. Signal probe pads 404 and 406 provide electrical connection to the base and collector regions (not shown), respectively, via a pair of conductive finger leads 408 and 410, respectively. An emitter ground probe pad 412 is connected to an emitter region (not shown) through a large contact 414.

A low resistance path, shown by the dashed lines 416, is obtained with a reach-through ion implantation, or the like, to electrically connect the emitter ground probe pad 412 and the large contact 414 to the subcollector layer outside an isolation trench. The subcollector region of the device under test is isolated from the grounded subcollector layer by the isolation trench surrounding it (not shown in FIG. 4, but described above). Using ion-implantation for the reach-through eliminates additional fabrication steps. Other methods used to form the reach-through 416 would be apparent to a person skilled in the relevant art.

According to the present invention, no resonance is observed during S-parameter tests due to parasitic signals, as compared to conventional test sites. The signal probe pad 404/406 acts as a series combination of a resistor and a capacitor to ground and is accurately calibrated with either a "full calibration" technique or the "open calibration." See, for example, van Wijnen, P. J., "A New Straightforward Calibration and Correction Procedure for on Wafer High Frequency S-Parameter Measurements (45 MHz–18 GHz)", Digest of 1987 Bipolar Circuits and Technology Meeting, pp. 70–73.

A significant advantage of the structure according to the present invention is the reduction in parasitic feed-through between port 1 and port 2 through the substrate. At 10 GHz, an AC grounded subcollector 202 reduces feed-through by about an order of magnitude. This significantly reduces the residual error of measurements on even very small (sub 5 µm$^2$) emitters.

The structure according to the present invention is also very attractive for microwave integrated circuits in silicon. Parasitic substrate conduction is a key problem for those applications. See, for example, Schmitz, et al., in "A Deep-Submicrometer Microwave/Digital CMOS/SOS Technology," IEEE Electron Device Lett., Vol. 12, No. 1, pp. 16–17, (1991); Caviglia, et al., in "Microwave Performance of SOI n-MOSFET's and Coplanar Waveguides," IEEE Electron Device Lett., Vol. 12, No. 1, pp. 26–27, (1991); Agarwal et al., in "MICROX—An Advanced Silicon Technology for Microwave Circuits up to X-Band," IEDM Technical Digest, pp. 687–690, (1991).

The standard solution to this parasitic effect in microwave devices is to use either very high resistivity substrates or Silicon-on-sapphire (SOS) substrates. Although more lossy, the present invention with a grounded subcollector outside the device of interest is a less expensive alternative as it requires no special process or wafer.

While the invention has been particularly shown and described with reference to preferred embodiments thereof, it will be understood by those skilled in the art that various changes in form and details, such as reversing the n- and p-type regions, may be made therein without departing from the spirit and scope of the invention.

Having thus described our invention, what we claim as new and desire to secure by Letters Patent is:

1. A semiconductor chip comprising:

a substrate having a first conductivity type;

a low resistivity semiconductor region in a plurality of non-device regions of the chip having a second conductivity type opposite said first conductivity type;

reach-through low resistivity regions electrically connected to said low resistivity semiconductor region having said second conductivity type; and a front-side contact electrically connected to said reach-through regions for electrically coupling said reach-through regions and said low resistivity semiconductor region to a ground potential to electrically ground said low resistivity semiconductor region, wherein said low resistivity semiconductor region is formed concurrently with buried subcollector regions formed in device regions of the chip.

2. The semiconductor chip according to claim 1, wherein said buried subcollector regions and said low resistivity semiconductor region are doped n$^+$ and are on said substrate.

3. The semiconductor chip according to claim 1, wherein said buried subcollector regions and said low resistivity semiconductor region are doped p$^+$ and are on said substrate.

4. The semiconductor chip according to claim 1, wherein said chip is formed in bulk silicon, and wherein said low resistivity semiconductor region is a buried region.

5. The semiconductor chip of claim 1 having device regions in which bipolar transistors are formed.

6. The semiconductor chip of claim 1 having device regions in which thin film transistors are formed.

7. A semiconductor chip comprising:
  a plurality of devices in trench isolation regions of the chip;
  a plurality of non-device regions outside of said trench isolation regions;
  buried low resistivity semiconductor regions within a plurality of said non-device regions;
  reach-through regions electrically connected to said buried low resistivity semiconductor regions; and
  top-side contacts to electrically connect said reach-through regions and said low resistivity semiconductor regions to a ground potential to thereby provide an on-chip ground plane.

8. The semiconductor chip according to claim 7, wherein at least one of said plurality of devices comprise bipolar transistors having buried subcollector regions; and
  wherein said buried subcollector regions and said buried low resistivity semiconductor regions comprise a single concurrently-formed semiconductor layer, but are electrically isolated by said trench isolation regions.

9. The semiconductor chip according to claim 8, wherein said buried subcollector regions and said buried low resistivity semiconductor regions are further electrically isolated by P-N junctions.

10. The semiconductor chip according to claim 8, wherein said chip includes a p$^-$ type substrate; and
  wherein said buried subcollector regions and said buried low resistivity semiconductor regions are doped n$^+$ and are on said substrate.

11. The semiconductor chip according to claim 8, wherein said chip includes a n$^-$ type substrate; and
  wherein said buried subcollector regions and said buried low resistivity semiconductor regions are doped p$^+$ and are on said substrate.

12. The semiconductor chip according to claim 8, wherein said chip includes a substrate; and
  wherein said buried subcollector regions and said buried low resistivity semiconductor regions are doped n$^+$ and are on said substrate.

13. The semiconductor chip according to claim 8, wherein said chip includes a substrate; and
  wherein said buried subcollector regions and said buried low resistivity semiconductor regions are doped p$^+$ and are on said substrate.

14. A method for providing an on-chip ground plane for a semiconductor chip, the method comprising the steps of:
  forming a plurality of device regions and a plurality of non-device regions on a substrate, wherein said device regions are coplanar with and laterally isolated from said non-device regions;
  providing high dopant concentration semiconductor regions in a substantial number of said plurality of non-device regions; and
  electrically connecting said high dopant concentration semiconductor regions to a ground potential to thereby provide the on-chip ground plane.

15. The method of claim 14 wherein the chip is formed on a silicon on insulator substrate having a thin silicon film, and
  wherein said high dopant concentration semiconductor regions are portions of said film.

16. The method of claim 14 further comprising the step of forming one of field effect transistors and bipolar transistors in said device regions.

17. A method for providing an on-chip ground plane for a semiconductor chip having a plurality of devices in trench isolation regions and non-device regions outside of the trench isolation regions, comprising the steps of:
  providing buried high dopant concentration semiconductor regions within a substantial number of the non-device regions of the chip; and
  electrically connecting said buried high dopant concentration semiconductor regions to a ground potential to thereby provide the on-chip ground plane.

18. A semiconductor chip comprising:
  a semiconductor device region formed on an insulating substrate;
  a low resistivity semiconductor non-device region coplanar with, and laterally isolated from, said device region;
  a front-side contact electrically connected to said non-device region for electrically coupling said non-device region to a ground potential so as to form an on-chip ground plane.

19. The semiconductor chip according to claim 18, wherein said device region comprises a field effect transistor.

20. A semiconductor chip comprising:
  a semiconductor device region formed on a substrate having a first conductivity type;
  a low resistivity semiconductor non-device region coplanar with, and laterally isolated from, said device region, and having a conductivity type opposite said first conductivity type;
  a front-side contact electrically connected to said non-device region for electrically coupling said non-device region to a ground potential so as to form an on-chip ground plane.

21. The semiconductor chip according to claim 20, wherein said device region comprises a buried subcollector region, and
  wherein said buried subcollector region and said non-device region are doped p$^+$.

22. The semiconductor chip according to claim 20, wherein said device region comprises a buried subcollector region, and
  wherein said buried subcollector region and said non-device region are doped n$^+$.

23. The semiconductor chip of claim 20 wherein said device region comprises a bipolar transistor.

24. The semiconductor chip of claim 20 wherein said device region comprises a thin film transistor.

* * * * *